US006593204B2

(12) United States Patent
Jaouen et al.

(10) Patent No.: US 6,593,204 B2
(45) Date of Patent: Jul. 15, 2003

(54) METHOD OF FABRICATING A SILICON-ON-INSULATOR SYSTEM WITH THIN SEMICONDUCTOR ISLETS SURROUNDED BY AN INSULATIVE MATERIAL

(75) Inventors: Hervé Jaouen, Meylan (FR); Vincent Le Goascoz, Claix (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 09/915,753

(22) Filed: Jul. 26, 2001

(65) Prior Publication Data

US 2002/0019083 A1 Feb. 14, 2002

(30) Foreign Application Priority Data

Jul. 28, 2000 (FR) .............................. 00 09987

(51) Int. Cl.⁷ ............................................. H01L 21/76
(52) U.S. Cl. ...................................... 438/406; 438/455
(58) Field of Search ................................ 438/142, 154, 438/404, 406, 455, 107

(56) References Cited

U.S. PATENT DOCUMENTS

| 5,073,230 A | | 12/1991 | Maracas et al. ............. 438/458 |
| 5,081,061 A | * | 1/1992 | Rouse et al. ................ 438/404 |
| 5,260,233 A | * | 11/1993 | Buti et al. ............ 148/DIG. 12 |
| 5,444,014 A | | 8/1995 | Ryum et al. ................. 438/311 |
| 5,585,661 A | * | 12/1996 | McLachlan et al. ......... 257/506 |
| 5,780,311 A | * | 7/1998 | Beasom et al. ....... 148/DIG. 50 |
| 5,985,681 A | * | 11/1999 | Hamajima et al. ............ 438/406 |
| 6,060,344 A | * | 5/2000 | Matsui et al. ................. 257/352 |
| 6,140,205 A | * | 10/2000 | Jennings ....................... 438/154 |
| 6,372,599 B1 | * | 4/2002 | Miyamoto et al. ........... 438/400 |

FOREIGN PATENT DOCUMENTS

DE 4033508 3/1992 ............ H01L/21/76

OTHER PUBLICATIONS

Auberton–Hervé, *SOI: Materials to Systems*, 1996, 8 pages.
Patent Abstracts of Japan, vol. 16, No. 324 (E–1234), Jul. 15, 1992 & JP 04096348 (Sharp Corp.) Mar. 27, 1992.

* cited by examiner

*Primary Examiner*—William David Coleman
(74) *Attorney, Agent, or Firm*—Lisa K. Jorgenson; Allen, Dyer, Doppelt, Milbrath & Gilchrist, P.A.

(57) ABSTRACT

A method of fabricating, from a first semiconductor substrate having two parallel main surfaces, a system including an islet of a semiconductor material surrounded by an insulative material and resting on another insulative material includes forming a layer of a first insulative material, and forming on the top main surface of the first semiconductor substrate a thin semiconductor layer forming the islet of semiconductor material. The thin semiconductor layer can be selectively etched relative to the first semiconductor substrate. A layer of a second insulative material is formed on exposed surfaces of the islet of semiconductor material and the thin semiconductor layer. The method further includes removing the first semiconductor substrate.

34 Claims, 3 Drawing Sheets

METHOD OF FABRICATING A SILICON-ON-INSULATOR SYSTEM WITH THIN SEMICONDUCTOR ISLETS SURROUNDED BY AN INSULATIVE MATERIAL

FIELD OF THE INVENTION

The present invention relates generally to a method of fabricating a system comprising a semiconductor substrate and a layer of insulative material on which the substrate rests, i.e., a silicon-on-insulator (SOI) system, and in particular, to a method of obtaining an SOI system including an extremely thin semiconductor layer of excellent uniformity made up of thin semiconductor islets surrounded by an insulative material and resting on a layer of another insulative material.

BACKGROUND OF THE INVENTION

SOI systems are more particularly intended to be used to make devices of the type referred to as "fully depleted" devices in which the charge carriers are fully depleted in the channel area. In such devices the thickness of the semiconductor substrate, also referred to as the active layer, defines the threshold voltage of the MOS transistors and proves to be very important.

A major problem with using fully depleted systems is producing a thin layer of semiconductor substrate on a layer of an insulative material with good control and sufficient reproducibility of the thickness of the active layer between two different systems obtained in the same manner and having the same destination.

To achieve the necessary performance, fully depleted structures would require active layers with a thickness on the order of 5 to 30 nm, depending on the threshold voltage to be obtained and the dimensions of the gates of the transistors. For a track width of 0.1 mm and a threshold voltage of approximately 0.35 volts, for example, the ideal silicon thickness is on the order of 15 nm. Any deficiency in the flatness of the active layer and any difference in thickness of the active layer between two systems leads to a corresponding variation in the threshold voltage. As a general rule, the flatness deficiency on the same active layer is small (on the order of a few percent), but the thickness difference from one system to another can be much greater.

Prior art SOI system fabrication techniques all have a number of drawbacks, in particular these drawbacks include a low production yield, relatively thick active and insulative layers of mediocre uniformity, which are difficult to reproduce from one system to another, and consequently a threshold voltage that is difficult to control.

A first SOI system fabrication method, known as the "SIMOX technology", includes forming a layer of silicon oxide buried in a silicon substrate by high-dose oxygen implantation followed by annealing at a temperature above 1,300° C. A major drawback of this method is that it requires non-standard equipment. Also, the high-dose oxygen implantation process takes a long time, which significantly reduces the production yield. Systems obtained by this method also suffer from insufficient quality of the buried silicon oxide layer and of the thin layer of silicon, due to a high density of pinholes.

In this method, the thickness of the silicon layers and the buried silicon oxide layers is determined by the implantation process, namely massive high-dose high-energy oxygen implantation. It is therefore particularly difficult to achieve a thickness of less than 50 nm for the residual silicon layer obtained by this method and less than 80 nm for the buried silicon oxide layer.

A second method, known as the "BESOI technique", includes forming an SOI system by forming a thin film of $SiO_2$ on the surface of a first silicon substrate, then uniting the first substrate with a second silicon substrate by means of the thin film of $SiO_2$, and finally eliminating a portion of one of the silicon substrates by grinding and mechanically polishing to form a thin layer of silicon on top of the buried silicon oxide layer. The silicon oxide layer on the first silicon substrate is formed by the successive steps of oxidizing the surface of the first substrate and etching the oxide layer formed to obtain the required thickness.

This method can produce only relatively thick buried silicon oxide layers and layers of silicon on the buried silicon oxide layers because of poor control over the etching process. The uniformity of thin layers obtained by this method is poor because of the mechanical steps, which generally cause a raised pattern on the surface of the active layer.

A third method, known as the "SMARTCUT technology" includes forming a thin film of silicon oxide on a first silicon substrate by oxidation, and then implanting $H^+$ ions in the first silicon substrate under the thin layer of silicon oxide to form a plane of cavities within it. The first substrate is then united with a second silicon substrate by means of the thin layer of silicon oxide. The resulting combination is then subjected to thermal activation for transforming the plane of cavities into a cutting plane.

This method yields an SOI system and a re-usable silicon substrate. It necessitates high-dose implantation of hydrogen atoms. Although hydrogen atoms are small, the surface of the thin layer of silicon obtained is damaged by the formation of pinholes. Also, using this technique does not generally produce a thickness of the thin layer of silicon less than about 50 nm.

In SOI systems obtained in this way the thickness of the active layer of silicon is determined by the hydrogen implantation, enabling cutting of the initial substrate and then final polishing of that layer. The flatness deficiency caused by this method is approximately 5 nm, regardless of the thickness of the final layer. It is therefore a major drawback for a thickness of less than 50 nm. Moreover, for a nominal thickness of less than 50 nm, for example, the variation in thickness from one wafer to another can be on the order of 25% to 40% of the average thickness of a batch of wafers, which forms a major handicap in the production of complex circuits because of the threshold voltage differences resulting from the thickness differences.

The above methods are described in particular in the article "SOI: Materials to Systems", A. J. Auberton-Hervé, 1996 IEEE.

SUMMARY OF THE INVENTION

In view of the foregoing background, an object of the present invention is to provide a method of fabricating an SOI system which remedies the drawbacks of the prior art methods.

This and other objects, advantages and features of the present invention are provided by a method of fabricating an SOI system that produces semiconductor substrates resting on a very thin, highly uniform and highly reproducible layer of an insulative material in the form of thin semiconductor islets surrounded by an insulative material.

According to one aspect of the invention, a method of fabricating, from a first semiconductor substrate having two parallel main surfaces, a system including an islet of a semiconductor material surrounded by an insulative material and resting on another insulative material includes the following steps:

a) producing a layer of a first insulative material intended to surround the semiconductor islet deposited on a top main surface of the first semiconductor substrate;

b) forming on the top main surface of the first semiconductor substrate a thin semiconductor layer forming the islet and which can be selectively etched relative to the first semiconductor substrate;

c) forming a layer of a second insulative material on the surface formed by the islet of the first insulative material and the thin semiconductor layer; and d) removing the first semiconductor substrate.

In the context of the invention the expression "main surfaces", when referring to a semiconductor substrate, means the largest surfaces of the substrate that are subjected to the various steps of the method, as opposed to its lateral surfaces.

According to another aspect of the invention, a bottom main surface of the first semiconductor substrate rests on a top main surface of a second semiconductor substrate which can be selectively etched relative to the first semiconductor substrate. Adding a second semiconductor substrate under the first semiconductor substrate reduces the cost of fabricating a system in accordance with the invention by reducing the thickness of the second semiconductor substrate and recovering a reusable semiconductor substrate when the first semiconductor substrate has been removed. This depends on the choice of the material forming the first semiconductor substrate which can be lost when it is removed.

According to another aspect of the invention, a trench is formed which opens onto the top main surface of the first semiconductor substrate, passes through the first semiconductor substrate and at least part of the second semiconductor substrate, and can be filled with a third insulative material which can be etched selectively relative to at least the first insulative material.

In particular, the trenches provide easier access to a larger surface area of the first semiconductor substrate and thereby reduce the time needed to remove the first semiconductor substrate. Filling them with a third insulative material facilitates the production of the layer of the first insulative material by virtue of the absence of holes on the top main surface of the first semiconductor substrate.

Preferably, the layer of the first insulative material is formed so as to cover only the trench and its near periphery, and the third insulative material filling the trench is removed before removing the first semiconductor substrate. The expression "near periphery" of the trench means an area extending at most 5 nm from the edge of the trench.

Accordingly, the layer of the first insulative material, which can be selectively etched relative to the third material that can fill the trenches, serves as a stop layer on removing the third material to reduce the time to remove the first semiconductor substrate, as previously mentioned.

According to a preferred aspect of the invention, and in particular if an edge crosses only a part of the second semiconductor substrate, the second semiconductor substrate is cut in a plane parallel to the main surfaces of the first semiconductor substrate which intersects the at least one trench. This provides access to the trenches so that the third insulative material therein can be removed, for example.

In accordance with another aspect of the invention the layer of the second insulative material is fixed to a layer of a fourth insulative material. This produces a greater thickness of insulation for supporting the semiconductor islets surrounded by an insulative material in the systems obtained in accordance with the invention. This also reduces the time needed to form the layer of the second insulative material.

In accordance with yet another aspect of the invention, the step of forming the layer of the first insulative material includes forming a layer of the first insulative material and etching thereof to form residual strips of the first insulative material and free areas intended to contain the semiconductor islets.

In accordance with another aspect of the invention, the thickness of the thin semiconductor layer forming the islets is substantially identical to the thickness of the layer of the first insulative material and is in the range from 3 to 15 nm. The expression "substantially identical" when referring to this thickness means varying by no more than 5%.

In accordance with another aspect of the invention, the layer of the second insulative material formed in step c) covers all of the surface formed by each thin semiconductor islet and the layer of the first insulative material.

In accordance with another aspect of the invention, the semiconductor substrates are chosen from monocrystalline or polycrystalline pure silicon, germanium, alloys of silicon and germanium $Si_{1-x}Ge_x$ (0<x<1), or alloys of silicon and germanium containing carbon $Si_{1-x-y}Ge_xC_y$ (0<x<0.95 and 0<y<0.95). The material forming the thin semiconductor layer forming the thin semiconductor islets and that forming the second semiconductor substrate are identical. The first semiconductor substrate is preferably a $Si_{1-x}Ge_x$ (0<x<1) alloy and the second semiconductor substrate is preferably monocrystalline silicon.

In accordance with another aspect of the invention the insulative materials are chosen from silicon oxides and silicon nitrides. In particular, the second, third and fourth insulative materials are identical. The first insulative material is preferably silicon nitride and the second insulative material is preferably silicon oxide.

In accordance with another aspect of the invention step c) of the method is performed by a selective epitaxial growth. Step d) of the method is preferably performed by selectively etching the second semiconductor material. In particular, the second semiconductor substrate may be cut using the "SMARTCUT" technology.

BRIEF DESCRIPTION OF THE DRAWINGS

The remainder of the description refers to the accompanying drawings, which illustrate diagrammatically two non-limiting embodiments of the method in accordance with the invention and show the SOI systems at various stages of fabrication.

DETAILED DESCRIPTION OF THE PREFERRED EMBODIMENTS

Figure 8:
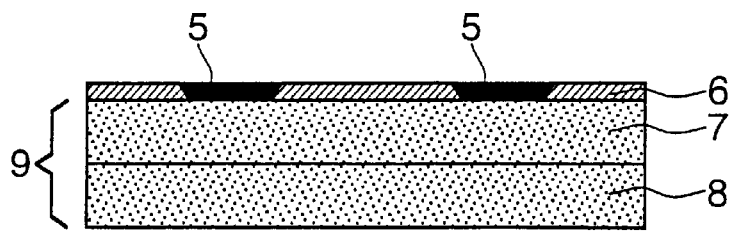

In particular, FIG. 8 shows the finished system comprising thin semiconductor material islets surrounded by a first insulative material, with the entire structure resting on a second insulative material.

Figure 1:
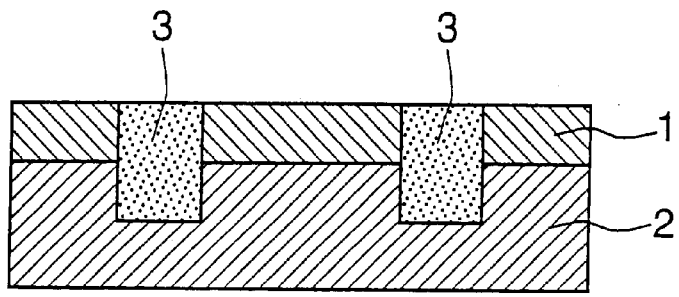
FIG. 1 is a sectional view of an initial system comprising two semiconductor substrates disposed one on the other with trenches formed therein and filled with an insulative material according to a first embodiment of the present invention.

Referring now to FIG. 1, the illustrated system comprises a first semiconductor substrate 1, made of SiGe alloy, for example, on which rests a second semiconductor substrate 2 formed of a different material, for example monocrystalline silicon. Two trenches 3 are formed and then filled with a first insulative material, for example with silicon oxide $SiO_2$. The trenches 3 cut through the first semiconductor substrate 1 and part of the second semiconductor substrate 2. The number of trenches 3 is not limited to that shown in FIG. 1, but the initial system used must incorporate at least one trench 3. The trenches 3 can be obtained by any prior art method, for example a prior art lateral insulation method known as Shallow Trench Isolation (STI) may be used.

The materials of the first semiconductor substrate 1 and the second semiconductor substrate 2 may be chosen from monocrystalline and polycrystalline pure silicon, germanium, alloys of silicon and germanium $Si_{1-x}Ge_x$ (0<x<1), or alloys of silicon and germanium containing carbon $Si_{1-x-y}Ge_xC_y$ (0<x<0.95 and 0<y<0.95) such that one can be selectively etched relative to the other. The selectivity to etching is particularly beneficial on executing the final steps of the method, in which some layers are selectively etched and removed to obtain the final system, without destroying the necessary layer.

Figure 2:
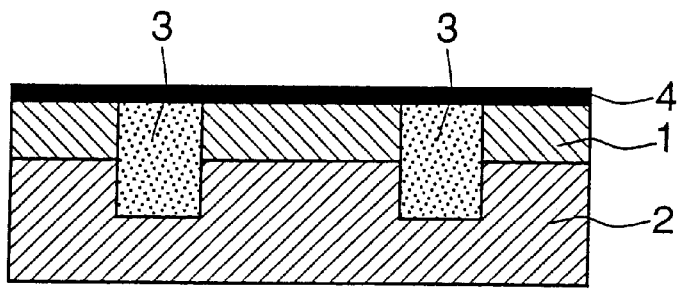
FIGS. 2 to 8 are sectional views based upon the initial system illustrated in FIG. 1 during various phases of the method.

For one particular embodiment, a layer 4 of a second insulative material, for example silicon nitride $Si_3N_4$, is then deposited over the whole surface of the first semiconductor substrate 1. The trenches 3 filled with the first insulative material are also covered with the layer 4 of the second insulative material, as shown in FIG. 2.

Figure 3:
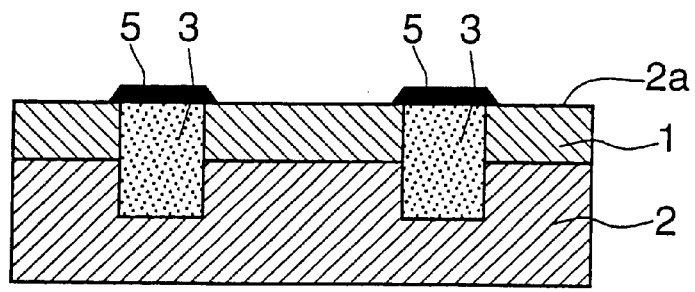

The layer 4 of the second insulative material is etched. This produces residual strips 5 of the second insulative material that covers the open surface of the first insulative material filling the trenches 3 and near the periphery of that open surface. Of course, in this particular embodiment of the method, the number of residual strips 5 obtained is exactly the same as the number of trenches 3. It is entirely possible to produce the residual strips 5 of the second insulative material by any method of localized deposition of insulative material. Thus the method is not limited to a sequence of deposition and etching steps with respect to a layer 4 of the second insulative material. FIG. 3 shows the combination obtained in this way.

Removing a part of the layer 4 of the second insulative material frees up a surface area 2a on the first semiconductor substrate 1. The second material is chosen from silicon oxides and nitrides such that the second material can be selectively etched relative to the first.

Figure 4:
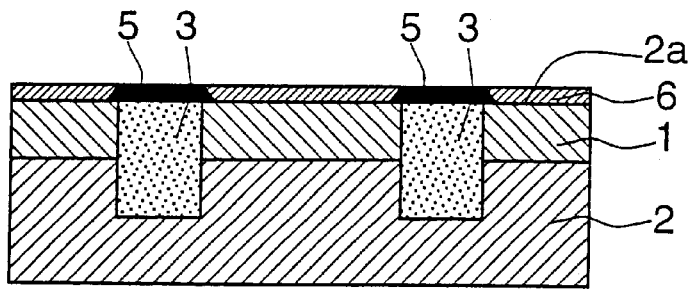

A thin semiconductor layer is formed on the free surface 2a of the second semiconductor substrate 2, forming thin semiconductor islets 6 whose composition is different from at least that of the second semiconductor substrate 2, as can be seen in FIG. 4. The thickness of the islets 6 is substantially identical to that of the residual strips 5 of the second insulative material. For example, the islets 6 can be made by selective epitaxial growth of monocrystalline silicon.

The choice of the semiconductor material forming the thin semiconductor islets 6 is dictated by the same considerations as before. This semiconductor material is also chosen from monocrystalline or polycrystalline pure silicon, germanium, alloys of silicon and germanium $Si_{1-x}Ge_x$ (0<x<1), or alloys of silicon and germanium containing carbon $Si_{1-x-y}Ge_xC_y$ (0<x<0.95 and 0<y<0.95).

Ideally, the same material is chosen for the thin semiconductor islets 6 as is used for the first semiconductor substrate 1, and the thickness of the semiconductor islets 6 is the same as that of the residual strips 5 of the second insulative material.

Figure 5:
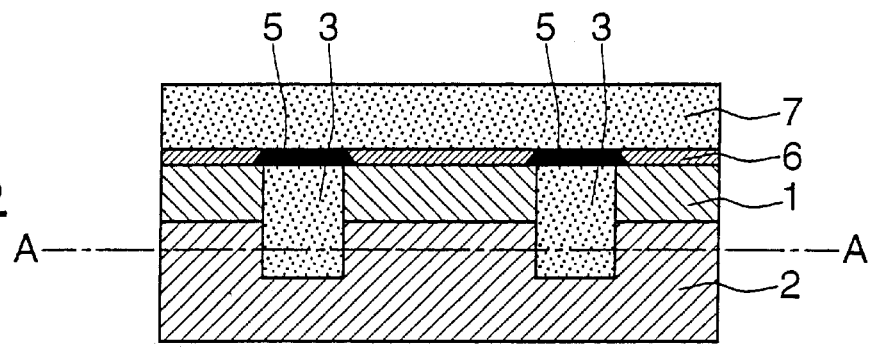

As shown in FIG. 5, all of the exposed surfaces formed by the residual strips 5 of the second insulative material and the thin semiconductor islets 6 previously deposited are covered with a layer of insulative material 7, for example silicon oxide, obtained by thermal oxidation or by any other prior art method. The material of the layer 7 is ideally the same as the first insulative material filling the trenches 3.

The first semiconductor substrate 1 is cut in the plane A—A parallel to the free surface 2a and intersects the trenches 3 filled with the first insulative material so that the insulative material contained in the trenches is exposed.

Figure 6:
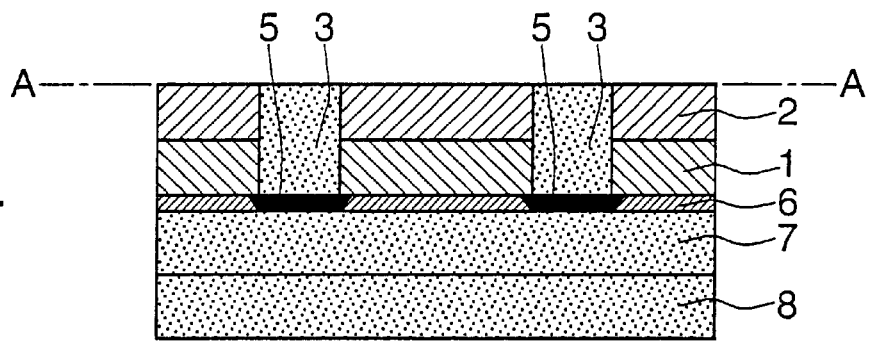

As shown in FIG. 6, the system formed in this way is then united with another layer of insulative material 8 by means of the insulative material layer 7. This is performed using a method that is known in the art and employs Van der Walls forces. The system can be annealed to strengthen mechanically the interface between the insulative material layers 7 and 8, if required. The layers 7 and 8 are preferably formed of the same insulative material to increase their mutual adhesion. The material is preferably silicon oxide, which is the simplest way to increase the mechanical strength by annealing.

Figure 7:
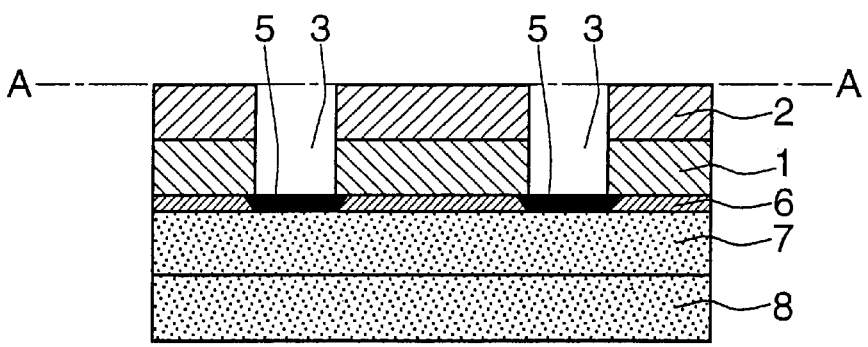

The first insulative material contained in the trenches 3 is removed. If the material is silicon oxide, wet etching using a solution based on hydrofluoric acid, as routinely employed, is entirely suitable for carrying out this step, for example. The structure shown in FIG. 7 is then obtained. The structure features two empty trenches 3 providing access to the second semiconductor substrate 2, which allows for selectively etching the second semiconductor substrate 2 through the trenches.

The second semiconductor substrate 2 is removed. To enable selective removal of the semiconductor substrate 2 without attacking the islets 6, as previously described, the composition of the second semiconductor substrate 2 differs from that of the thin islets 6 and even from that of the first semiconductor substrate 1. For example, the second semiconductor material can be a $Si_{1-x}Ge_x$ (0<x<1) alloy which is easy to eliminate selectively, either by means of wet oxidizing chemical agents, for example a solution containing 40 ml 70% $HNO_3$+20 ml $H_2O_2$+5 ml 0.5% HF, or by isotropic plasma etching. The passage created by the trenches 3 emptied in this way also provides easier access to the second semiconductor substrate 2 to be eliminated. A large number of trenches 3 not only makes it possible to produce a greater number of residual strips 5 but also increases the rate at which the second semiconductor substrate 2 can be removed.

The system shown in FIG. 8 is obtained. FIG. 8 is a view in section of a system which includes thin semiconductor islets 6 surrounded by residual strips 5 of the layer 4 of the first insulative material, which rests on a layer of insulative material 9 formed by the layers of the insulative materials 7 and 8.

Figure 9:
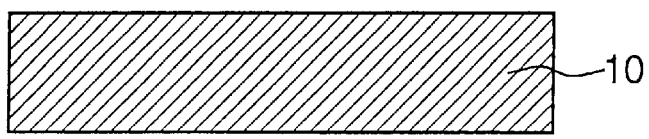
FIG. 9 is a sectional view of an initial semiconductor substrate according to a second embodiment of the present invention.
Figure 12:
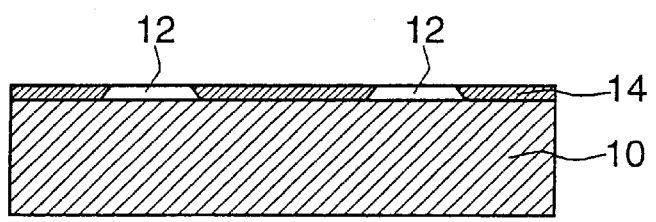
Figure 13:
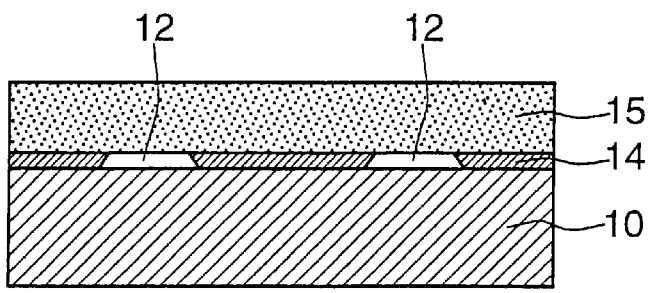
Figure 14:
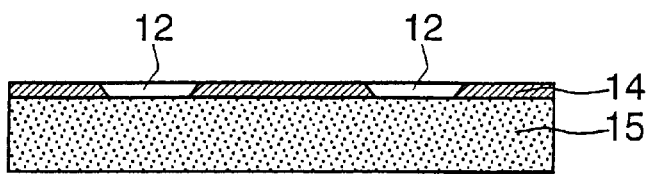

FIGS. 9 to 14 relate to a second embodiment of the method. FIG. 9 is a sectional view of a first initial semiconductor substrate. FIGS. 10 to 14 are sectional views of the system during various phases of the method. In particular, FIG. 14 shows the finished system including semiconductor islets surrounded by a first insulative material, and resting on a second insulative material.

The material forming the first semiconductor substrate 10 shown in FIG. 9 can be chosen from monocrystalline or polycrystalline pure silicon, germanium, alloys of silicon and germanium $Si_{1-x}Ge_x$ (0<x<1), or alloys of silicon and germanium containing carbon $Si_{1-x-y}Ge_xC_y$ (0<x<0.95 and 0<y<0.95). For reasons of cost and technology, the chosen material is preferably polycrystalline silicon.

Figure 10:
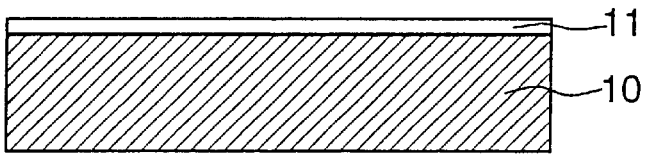
FIGS. 10 to 14 are sectional views based upon the semiconductor substrate illustrated in FIG. 9 during various phases of the method.

In one particular embodiment a layer 11 of a first insulative material, for example silicon nitride $Si_3N_4$, is then deposited over the whole of the surface of the first semiconductor substrate 10, as show in FIG. 10.

Figure 11:
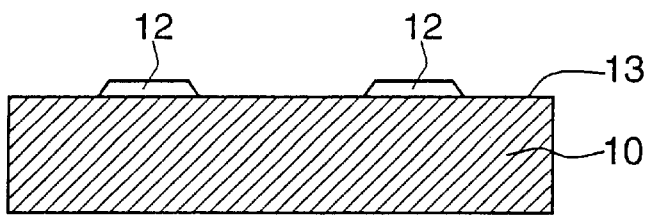

The layer 11 of the first insulative material is etched. Residual strips 12 of the first insulative material are obtained in this way. In this particular embodiment of the method, the number of residual strips 12 is not limited to that shown in FIG. 11, of course. It is entirely possible to produce the residual strips 12 of the second insulative material by any method of localized deposition of insulative material. The method is therefore not limited to a sequence of steps of depositing and etching a layer 11 of first insulative material. FIG. 11 shows the system obtained in this way.

Removing a portion of the layer 11 of the first insulative material frees up a surface 13 on the first semiconductor substrate 10. Thin semiconductor islets 14 are formed on the free surface 13 of the first semiconductor substrate 10, their composition differing at least from that of the first semiconductor substrate 10, as shown in FIG. 12. The thickness of the islets 14 is substantially identical to that of the residual strips 12 of the first insulative material. For example, the islets 14 can be made by selective epitaxial growth and can include a semiconductor material chosen from monocrystalline or polycrystalline pure silicon, germanium, alloys of silicon and germanium $Si_{1-x}Ge_x$ (0<x<1), or alloys of silicon and germanium containing carbon $Si_{1-x-y}Ge_xC_y$ (0<x<0.95 and 0<y<0.95).

Alloys of silicon and germanium $Si_{1-x}Ge_x$ (0<x<1) are ideally chosen for the thin semiconductor islets 14. As shown in FIG. 13, all of the surface formed by the residual strips 12 of the first insulative material and the thin semiconductor islets 14 previously deposited is covered with a layer of an insulative material 15, for example a layer of silicon oxide obtained by thermal oxidation or by any other prior art method.

The first semiconductor substrate 10 is removed. The composition of the second semiconductor substrate 2, which is different from that of the thin islets 14, allows selective removal of the first semiconductor substrate 10 without attacking the thin islets 14, as previously described. This removal can ideally be effected by any prior art method.

FIG. 14 shows the system obtained in this way and is a sectional view of a system which includes thin semiconductor islets 14 surrounded by the residual strips 12 of the layer 11 of the first insulative material, and resting on a layer of the insulative material 15.

The systems obtained in this way are perfectly reproducible in the sense that the thickness of the various substrates and layers varies little from one system to another and these systems are therefore particularly suitable for the production of fully depleted devices.

That which is claimed is:

1. A method of fabricating, from a first semiconductor substrate having two parallel main surfaces, a system including at least one islet of a semiconductor material surrounded by a layer of a first insulative material and resting on a layer of a second insulative material, the method comprising:

forming the layer of the first insulative material on selected portions of a top main surface of the first semiconductor substrate;

forming a semiconductor layer on the top main surface of the first semiconductor substrate adjacent the selected portions thereof to define the at least one islet of semiconductor material, the semiconductor layer being selectively etchable relative to the first semiconductor substrate;

forming the layer of the second insulative material on exposed surfaces of the at least one islet of semiconductor material and of the layer of the first insulative material; and removing the first semiconductor substrate.

2. A method according to claim 1, further comprising placing a bottom main surface of the first semiconductor substrate on a top main surface of a second semiconductor substrate which is selectively etchable relative to the first semiconductor substrate.

3. A method according to either claim 2, further comprising:

forming at least one trench in the first semiconductor substrate which opens onto the top main surface thereof, the at least one trench passes through the first semiconductor substrate and at least a portion of the second semiconductor substrate; and filling the at least one trench with a third insulative material which is selectively etchable relative to at least the first insulative material.

4. A method according to claim 3, wherein the selected portions of the top main surface of the first semiconductor substrate include the third insulative material in the at least one trench and its near periphery.

5. A method according to claim 3, further comprising cutting the second semiconductor substrate in a plane parallel to the two main parallel surfaces of the first semiconductor substrate which intersects the at least one trench.

6. A method according to claim 3, further comprising removing the third insulative material before removing the first semiconductor substrate.

7. A method according to claim 3, further comprising forming a layer of a fourth insulative material on a bottom main surface of the layer of the second insulative material.

8. A method according to claim 1, wherein forming the layer of the first insulative material on selected portions of the top main surface of the first semiconductor substrate comprises:

forming the layer of the first insulative material on the top main surface of the first semiconductor layer; and selectively etching the layer of the first insulative material to define residual strips of the layer of the first insulative material and to define areas exposing the top main surface of the first semiconductor substrate for the at least one islet of semiconductor material.

9. A method according to claim 1, wherein a thickness of the semiconductor layer is substantially equal to a thickness of the layer of the first insulative material which is in a range of about 3 to 15 nm.

10. A method according to claim 1, wherein forming the layer of the second insulative material is formed to cover all of the exposed surfaces of the at least one islet of semiconductor material and the layer of the first insulative material.

11. A method according to claim 1, wherein the first and second semiconductor substrates and the semiconductor layer each comprises at least one of monocrystalline silicon, polycrystalline silicon, germanium, alloys of silicon and germanium $Si_{1-x}Ge_x$ (0<x<1), and alloys of silicon and germanium containing carbon $Si_{1-x-y}Ge_xC_y$ (0<x<0.95 and 0<y<0.95).

12. A method according to claim 1, wherein the semiconductor layer and the second semiconductor substrate each comprises a same material.

13. A method according to claim 11, wherein the first semiconductor substrate comprises a $Si_{1-x}Ge_x$ (0<x<1) alloy and the second semiconductor substrate comprises monocrystalline silicon.

14. A method according to claim 7, wherein the first, second, third and fourth insulative materials each comprises at least one of silicon oxide and silicon nitride.

15. A method according to claim 7, wherein the second, third and fourth insulative materials each comprises a same material.

16. A method according to claim 1, wherein the first insulative material comprises silicon nitride and the second insulative material comprises silicon oxide.

17. A method according to claim 1, wherein forming the layer of the second insulative material is formed by a selective epitaxial growth.

18. A method of fabricating, from a first semiconductor substrate having two parallel main surfaces, a system including at least one islet of a semiconductor material surrounded by a layer of a first insulative material and resting on a layer of a second insulative material, the method comprising:

forming at least one trench in the first semiconductor substrate which opens onto the top main surface thereof;

filling the at least one trench with an insulative material;

forming a layer of the first insulative material on the insulative layer in the at least one trench and its near periphery;

forming a semiconductor layer on the top main surface of the first semiconductor substrate adjacent the layer of the first insulative layer to define the at least one islet of semiconductor material;

forming the layer of the second insulative material on exposed surfaces of the at least one islet of semiconductor material and of the layer of the first insulative material; and removing the first semiconductor substrate and the insulative material in the at least one trench.

19. A method according to claim 18, wherein the insulative layer in the at least one trench is selectively etchable relative to at least the first insulative material; and wherein the semiconductor layer is selectively etchable relative to the first semiconductor substrate.

20. A method according to claim 18, further comprising placing a bottom main surface of the first semiconductor substrate on a top main surface of a second semiconductor substrate which is selectively etchable relative to the first semiconductor substrate.

21. A method according to either claim 20, wherein forming the at least one trench comprises forming the at least one trench to pass through the first semiconductor substrate and at least a portion of the second semiconductor substrate.

22. A method according to claim 21, further comprising cutting the second semiconductor substrate in a plane parallel to the two main parallel surfaces of the first semiconductor substrate which intersects the at least one trench.

23. A method according to claim 18, further comprising removing the insulative material from the at least one trench before removing the first semiconductor substrate.

24. A method according to claim 20, further comprising forming a layer of a third insulative material on a bottom main surface of the layer of the second insulative material.

25. A method according to claim 18, wherein forming the layer of the first insulative material comprises:

forming the layer of the first insulative material on the top main surface of the first semiconductor layer; and selectively etching the layer of the first insulative material to define residual strips of the layer of the first insulative material on the insulative layer in the at least one trench and its near periphery and to define areas exposing the top main surface of the first semiconductor substrate for the at least one islet of semiconductor material.

26. A method according to claim 18, wherein a thickness of the semiconductor layer is substantially equal to a thickness of the layer of the first insulative material which is in a range of about 3 to 15 nm.

27. A method according to claim 18, wherein forming the layer of the second insulative material is formed to cover all of the exposed surfaces of the at least one islet of semiconductor material and the layer of the first insulative material.

28. A method according to claim 18, wherein the first and second semiconductor substrates and the semiconductor layer each comprises at least one of monocrystalline silicon, polycrystalline silicon, germanium, alloys of silicon and germanium $Si_{1-x}Ge_x$ (0<x<1), and alloys of silicon and germanium containing carbon $Si_{1-x-y}Ge_xC_y$ (0<x<0.95 and 0<y<0.95).

29. A method according to claim 18, wherein the semiconductor layer and the second semiconductor substrate each comprises a same material.

30. A method according to claim 28, wherein the first semiconductor substrate comprises a $Si_{1-x}Ge_x$ (0<x<1) alloy and the second semiconductor substrate comprises monocrystalline silicon.

31. A method according to claim 24, wherein the insulative material in the at least one trench, and the first, second and third insulative materials each comprises at least one of silicon oxide and silicon nitride.

32. A method according to claim 24, wherein the insulative material in the at least one trench, and the second and third insulative materials each comprises a same material.

33. A method according to claim 18, wherein the first insulative material comprises silicon nitride and the second insulative material comprises silicon oxide.

34. A method according to claim 18, wherein forming the layer of the second insulative material is formed by a selective epitaxial growth.

* * * * *